(12) United States Patent
Lee et al.

(10) Patent No.: US 8,927,854 B2
(45) Date of Patent: Jan. 6, 2015

(54) SOLAR CELL AND METHOD FOR MANUFACTURING THE SAME

(75) Inventors: Jinhyung Lee, Seoul (KR); Junyong Ahn, Seoul (KR); Younghyun Lee, Seoul (KR)

(73) Assignee: LG Electronics Inc., Seoul (KR)

( * ) Notice: Subject to any disclaimer, the term of this patent is extended or adjusted under 35 U.S.C. 154(b) by 391 days.

(21) Appl. No.: 13/270,944

(22) Filed: Oct. 11, 2011

(65) Prior Publication Data

US 2012/0085398 A1    Apr. 12, 2012

(30) Foreign Application Priority Data

Oct. 11, 2010  (KR) .................... 10-2010-0098938

(51) Int. Cl.
| | | |
|---|---|---|
| H01L 31/0236 | (2006.01) | |
| H01L 31/028 | (2006.01) | |
| H01L 31/04 | (2014.01) | |
| H01L 31/068 | (2012.01) | |
| H01L 31/18 | (2006.01) | |

(52) U.S. Cl.
CPC .......... H01L 31/068 (2013.01); H01L 31/1804 (2013.01); *Y02E 10/52* (2013.01); *Y02E 10/547* (2013.01)
USPC ............ 136/256; 136/252; 136/255; 136/261

(58) Field of Classification Search
CPC ............... H01L 31/022458; H01L 31/022425; H01L 31/068; H01L 31/1804; H01L 31/02167; H01L 31/03529; H01L 31/042; H01L 31/48; H01L 31/05; H01L 31/0527; H01L 31/18; H01L 31/1896; H01L 27/1423; Y02E 10/52; Y02E 10/547; Y02E 10/50; Y02E 10/544; Y02E 10/546; Y02E 10/548
USPC .................................. 136/243–265
See application file for complete search history.

(56) References Cited

U.S. PATENT DOCUMENTS

| | | | |
|---|---|---|---|
| 3,758,348 A | 9/1973 | Whigham et al. | |
| 2003/0134469 A1* | 7/2003 | Horzel et al. | 438/249 |
| 2010/0218826 A1* | 9/2010 | Hahn et al. | 136/261 |
| 2010/0326504 A1* | 12/2010 | Park et al. | 136/255 |
| 2011/0139226 A1* | 6/2011 | Ha et al. | 136/252 |

FOREIGN PATENT DOCUMENTS

| | | |
|---|---|---|
| FR | 2499316 A1 | 8/1982 |
| JP | 2002-314106 A | 10/2002 |
| KR | 10-2008-0050863 A | 6/2008 |

* cited by examiner

*Primary Examiner* — Eli Mekhlin
*Assistant Examiner* — Mayla Gonzalez Ramos
(74) *Attorney, Agent, or Firm* — Birch, Stewart, Kolasch & Birch, LLP

(57) ABSTRACT

A solar cell includes a first conductivity type substrate; an emitter unit having a second conductivity type opposite to the first conductivity type, and forming a p-n junction with the substrate; an anti-reflective film positioned on the emitter unit; a plurality of first electrodes positioned on the anti-reflective film and connected with the emitter unit; and a second electrode connected with the substrate, wherein the emitter unit includes a first region and a second region that are positioned between an outermost first electrode among the plurality of first electrodes and the edge of the substrate, and a thickness of the first region gradually increases in going from the edge of the substrate to the outermost first electrode, and a thickness of the second region is uniform.

9 Claims, 7 Drawing Sheets

SOLAR CELL AND METHOD FOR MANUFACTURING THE SAME

This application claims priority to and the benefit of Korean Patent Application No. 10-2010-0098938 filed in the Korean Intellectual Property Office on Oct. 11, 2010, the entire contents of which are incorporated herein by reference.

BACKGROUND OF THE INVENTION

1. Field of the Invention

Embodiments of the invention relate to a solar cell and a manufacturing method thereof.

2. Description of the Related Art

In general, a solar cell includes a substrate and an emitter layer made of different conductivity type semiconductors such as a p type semiconductor and an n type semiconductor, and electrodes connected to the substrate and the emitter layer, respectively. In this instance, a p-n junction is formed at the interface of the substrate and the emitter layer.

When light is made incident to the solar cell, a plurality of electron-hole pairs are generated in the semiconductor. The generated electron-hole pairs are separated into electrons and holes, having electric charges, by a photovoltaic effect, the electrons and holes move toward the n type semiconductor and the p type semiconductor (e.g., toward the emitter layer and the substrate), respectively, and are collected by electrodes connected to the substrate and the emitter layer, respectively, whereby, the electrodes are connected by an electric wire to obtain power.

SUMMARY OF THE INVENTION

According to an aspect of the invention, a solar cell includes: a first conductivity type substrate; an emitter unit having a second conductivity type opposite to the first conductivity type, and forming a p-n junction with the substrate; an anti-reflective film positioned on the emitter unit; a plurality of first electrodes positioned on the anti-reflective film and connected with the emitter unit; and a second electrode connected with the substrate, wherein the emitter unit includes a first region and a second region that are positioned between an outermost first electrode among the plurality of first electrodes and the edge of the substrate, and a thickness of the first region gradually increases in going from the edge of the substrate to the outermost first electrode, and a thickness of the second region is uniform.

The second region is located between the first region and the outermost first electrode.

The thickness of the second region is equal to a thickness of the emitter unit positioned between mutually adjacent first electrodes.

A length of the second region is 1400 μm or smaller.

The emitter unit further includes a first emitter layer and a second emitter layer, the first emitter layer having impurities of the second conductivity type doped therein and being positioned between mutually adjacent first electrodes, and the second emitter layer having the impurities of the second conductivity type doped with a higher concentration than that of the first emitter layer and being positioned under the plurality of first electrodes.

The second emitter layer includes the second region.

A thickness of the first layer and a thickness of the second layer are uniform, respectively, and the thickness of the first layer is less than the thickness of the second layer.

A length of the first region is 1500 μm or smaller.

A rear field unit connected to the second electrode.

According to another aspect of the invention, a method for fabricating a solar cell includes: forming a second conductivity type emitter unit on a first conductivity type substrate, the first and second conductivity types being opposite types; performing edge isolation to remove a portion of the emitter unit formed on a side surface of the substrate; and forming a front electrode electrically connected with the emitter unit and a rear electrode electrically connected with the substrate, wherein the performing of edge isolation includes: forming a first anti-etching mask on a portion of a front surface of the substrate in order to prevent a portion of the emitter unit formed on the front surface of the substrate from being etched; immersing the substrate in an etching solution so as to remove the portion of the emitter unit formed on the side surface of the substrate; and removing the first anti-etching mask.

The forming of the emitter unit includes: forming a second anti-etching mask at an area on the emitter unit where the front electrode is to be formed; and etching back the emitter unit to form a first emitter layer with impurities of the second conductivity type doped therein, and a second emitter layer having the impurities of the second conductivity type doped with a higher concentration than that of the first emitter layer.

The second anti-etching mask for forming the first and second emitter layers and the first anti-etching mask for the edge isolation are simultaneously formed.

The forming of the first and second emitter layers, and the edge isolating are simultaneously performed through wet etching.

The first anti-etching mask is formed to be spaced apart by a certain distance from the edge of the substrate, and the certain distance from the edge of the substrate to the anti-etching mask is 1.5 mm or smaller.

The first anti-etching mask is formed to include a plurality of lines.

Forming an anti-reflective film on the emitter unit.

The forming of the front electrode and the rear electrode includes: applying a front electrode paste to a front surface of the emitter unit; applying a rear electrode paste to a rear surface of the substrate; and thermally treating the front electrode paste and the rear electrode paste to form the front electrode electrically connected with the emitter unit and the rear electrode electrically connected with the substrate, respectively.

The portion of the emitter unit is formed on the front surface of the substrate to include a first region and a second region that are positioned between the edge of the substrate and an interior thereof, and a thickness of the first region gradually increases in going from the edge of the substrate to the interior, and a thickness of the second region is uniform.

The forming of the first anti-etching mask forms the first anti-etching mask to enclose most of the entire front surface of the substrate.

BRIEF DESCRIPTION OF THE DRAWINGS

The accompany drawings, which are included to provide a further understanding of the invention and are incorporated and constituted as a part of this disclosure, illustrate embodiments of the invention and together with the description serve to explain the principles of the invention.

DETAILED DESCRIPTION OF THE EMBODIMENTS

Hereinafter, exemplary embodiments will be described in detail with reference to the accompanying drawings so that they can be easily practiced by those skilled in the art to which the invention pertains. The invention may, however, be embodied in many different forms and should not be construed as being limited to the embodiments set forth herein. In order to clarify the invention, parts irrespective of description will be omitted, and similar reference numerals are used for the similar parts throughout the specification.

In the drawings, the shapes and dimensions may be exaggerated for clarity, and it will be understood that when an element or layer is referred to as being "on" or "connected to" another element or layer, it can be directly on or directly connected to the other element or layer, or intervening elements or layers may be present. In contrast, when an element is referred to as being "directly on" or "directly connected to" another element or layer, there are no intervening elements or layers present. Also, when a portion is referred to as being "entirely" formed on another portion, it may not be formed on a portion of edges, as well as being formed on the entire surface (or a front surface).

A solar cell and a fabrication method thereof according to various embodiments of the invention will be described with reference to the accompanying drawings.

A solar cell according to an embodiment of the invention will be described with reference to FIGS. 1 and 2.

Figure 1:
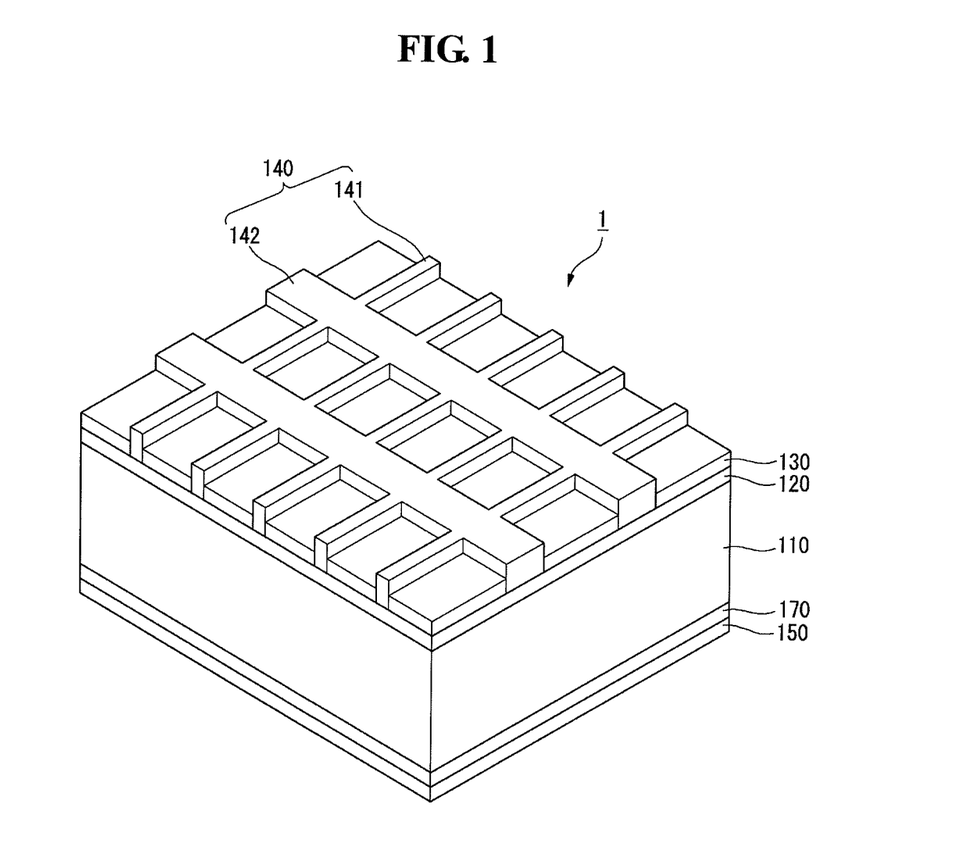
FIG. 1 is a partial perspective view of a solar cell according to an embodiment of the invention.

FIG. 1 is a partial perspective view of a solar cell according to an embodiment of the invention. FIG. 2 is a sectional view of the solar cell taken in a direction parallel to a front electrode collection unit and including a portion of the edge of the solar cell according to an embodiment of the invention.

With reference to FIG. 1, a solar cell 1 according to an embodiment of the invention includes a substrate 110, an emitter unit 120 positioned on an incident face (referred to as a 'front surface', hereinafter) of the substrate 110 to which light is made incident, an anti-reflective film 130 positioned on the emitter unit 120, a rear field unit 170 positioned on a rear surface of the substrate 110 opposed to the front surface of the substrate 110, a plurality of first electrodes (or front electrodes) 141 electrically connected with the emitter unit 120, a plurality of first electrode current collection units 142 connected with the plurality of first electrodes and extending to cross the plurality of first electrodes 141, and a second electrode (or a rear electrode) 150 positioned on a rear surface of the rear field unit 170 and electrically connected with the substrate 110.

Hereinafter, the first electrodes 141 will be referred to as front electrodes 141, the first electrode current collection units 142 will be referred to as front electrode current collection units 142, and the second electrode 150 may be referred to as a rear electrode 150.

The substrate 110 is a semiconductor substrate made of a first conductivity type, e.g., a p conductivity type silicon. In this instance, the silicon may be single crystal silicon, polycrystalline silicon, or amorphous silicon. When the substrate 110 is of the p conductivity type, it contains impurities of a trivalent element such as boron (B), gallium (Ga), indium (In), or the like. However, the substrate 110 may alternatively be an n conductivity type substrate, and may also be made of any semiconductor material other than silicon. When the substrate 110 has an n conductivity type, the substrate 10 may contain impurities of a pentavalent element such as phosphorous (P), arsenic (As), antimony (Sb), or the like.

The substrate 110 may be textured to have a textured surface with a plurality of depressions and/or protrusions.

The emitter unit 120 is an impurity unit having a second conductivity type, e.g., an n conductivity type, which is the opposite to the conductivity type of the substrate 110, and which forms a p-n junction with the semiconductor substrate 110.

Electron-hole pairs, having electric charges, and generated by light made incident onto the substrate 110, are separated into electrons and holes due to a built-in potential difference caused by the p-n junction, whereby the electrons move toward the n type semiconductor and the holes move toward the p type semiconductor. Thus, when the substrate 110 is a p type semiconductor and the emitter unit 120 is an n type semiconductor, the separated holes move toward the substrate 110, and the separated electrons move toward the emitter unit 120. In the substrate 110, the holes become the majority carriers, and in the emitter unit 120, the electrons become the majority carriers.

The emitter unit 120 forms the p-n junction with the substrate 110. Thus, unlike this embodiment, when the substrate 110 is of the n conductivity type, the emitter unit 120 may be of the p conductivity type. In this instance, the separated electrons move toward the substrate 110, and the separated holes move toward the emitter unit 120.

When the emitter unit 120 is of the n conductivity type, the emitter unit 120 may be formed by doping impurities of a pentavalent element such as phosphorous (P), arsenic (As), antimony (Sb), or the like, on the substrate 110, and conversely, when the emitter unit 120 is of the p conductivity type, the emitter unit 120 may be formed by doping impurities of a trivalent element such as boron (B), gallium (Ga), indium (In), or the like, on the substrate 110.

In this instance, the emitter unit 120 is formed by diffusing impurities on the entire surface including the front surface, the rear surface, and side surfaces of the substrate 110. However, when the front surface and the rear surface of the solar cell are connected to thereby reduce the efficiency of the solar cell, after doping the impurities, an edge isolation process is performed to eliminate the doped portion of the side surfaces (or edges) to electrically isolate the front and rear surfaces. Accordingly, in this embodiment, an anti-etching mask is formed on the emitter unit 120 and then the edge isolation process is performed through wet etching. In this instance, the edge isolation process according to an embodiment of the invention will be described later with reference to FIGS. 5A to 5F.

The anti-reflective film 130 made of silicon nitride film (SiNx), a silicon oxide film ($SiO_2$), a silicon oxynitride film (SiOxNy), or the like, is formed on the emitter unit 120. The anti-reflective film 130 reduces reflectance of light made incident to the solar cell 1 and increases selectivity of a particular wavelength region (or band), thus enhancing efficiency of the solar cell 1. The anti-reflective film 130 optionally may be omitted, if desired.

The plurality of front electrodes 141 are positioned on the emitter unit 120, electrically connected with the emitter unit 120, and separately extend in a predetermined direction. The plurality of front electrodes 141 collect electric charges, e.g., electrons, which have moved toward the emitter unit 120.

The plurality of front electrode current collection units 142 are positioned on the same layer of the emitter unit 120 on which the plurality of front electrodes 141 are positioned, and extend to cross the plurality of front electrodes 141. The plurality of front electrode current collection units 142 collect electric charges that have been collected by the plurality of front electrodes 141, and output the collected electric charges to an external device.

The plurality of front electrodes 141 and the front electrode current collection units 142 are made of at least one conductive material. In this instance, the conductive material may be, for example, at least one selected from the group consisting of nickel (Ni), copper (Cu), silver (Ag), aluminum (Al), tin (Sn), zinc (Zn), indium (In), titanium (Ti), gold (Au), and any combination thereof. However, the plurality of front electrodes 141 and the plurality of front electrode current collection units 142 may also be made of any other conductive metal materials.

The rear electrode 150 positioned on the rear surface of the substrate 110 collects electric charges, e.g., holes, moving toward the substrate 110.

The rear electrode 150 may be made of at least one conductive material. The conductive material may be at least one selected from the group consisting of nickel (Ni), copper (Cu), silver (Ag), aluminum (Al), tin (Sn), zinc (Zn), indium (In), titanium (Ti), gold (Au), and any combination thereof. However, the rear electrode 150 may also be made of any other conductive metal materials.

The solar cell 1 according to an embodiment of the invention may further include a plurality of rear electrode current collection units extending in the same direction in which the front electrode current collection units 142. In this instance, the plurality of rear electrode current collection units may be positioned to face (or be aligned with) the front electrode current collection units 142. The plurality of rear electrode current collection units may collect electric charges, e.g., holes, transferred from the rear electrode 150 and output the collected holes to an external device.

The plurality of rear electrode current collection units may be made of at least one conductive material. The conductive material may be at least one selected from the group consisting of nickel (Ni), copper (Cu), silver (Ag), aluminum (Al), tin (Sn), zinc (Zn), indium (In), titanium (Ti), gold (Au), and any combination thereof. However, the plurality of rear electrode current collection units may also be made of any other conductive metal materials.

The rear field unit 170 is positioned between the rear electrode 150 and the substrate 110. The rear field unit 170 may be a region in which the same conductivity type impurities as that of the substrate 110 are doped with higher concentration than that of the substrate 110, e.g., a p+ region.

A potential barrier is formed due to the difference in impurity density between the substrate 110 and the rear field unit 170, and accordingly, the movement of electrons toward the rear surface of the substrate 110 is hampered, thus reducing electron-hole recombination that causes extinction of the charges at the rear surface portion of the substrate 110.

Figure 2:
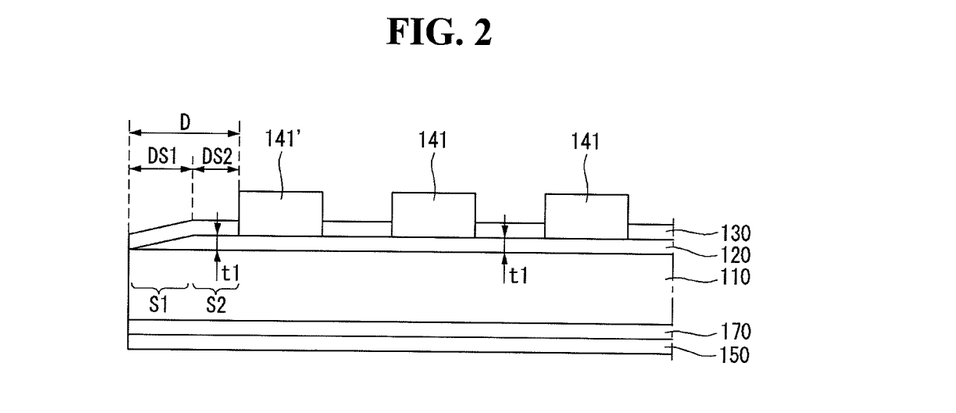
FIG. 2 is a sectional view of the solar cell taken in a direction parallel to a front electrode collection unit and including a portion of the edge of the solar cell according to an embodiment of the invention.

As shown in FIG. 2, in the solar cell according to an embodiment of the invention, among portions of the emitter unit 120, a portion of the emitter unit 120 positioned between the outermost front electrode 141' among the plurality of front electrodes 141 and the edge of the substrate 110 include a first region S1 in which the thickness of the emitter unit 120 is increasing in going towards the outermost front electrode 141' from the edge of the substrate 110, and a second region S2 in which the thickness from the first region S1 to the outermost front electrode 141' is uniform at t1. Accordingly, the portion of the emitter unit 120 in the first region S1 has an inclined surface.

For reference, the portion of the emitter unit 120 positioned at the edge of the substrate 110 may play the same function as that portion of the emitter unit 120 positioned under the front electrode 141 or that portion of the emitter unit 120 positioned between adjacent front electrodes 141.

In this instance, the thickness t1 of the second region S2 may be equal to the thickness t1 of the emitter unit 120 positioned between mutually adjacent front electrodes 141.

In this instance, a reason why the thickness of the portion of the emitter unit 120 located towards the edge of the substrate 110 in the first region S1 of the emitter unit 120 is thinner is because an etching solution invades the portion of the emitter unit 120 positioned at the upper edge of the substrate 110 due to hydrophilic characteristics of the emitter unit 120 when portions of the emitter unit 120 formed at the side surface and the lower surface of the substrate 110 are eliminated through wet etching. This will be described in detail later with reference to FIGS. 5A to 5F.

Thus, in the solar cell 1 according to this embodiment, sheet resistance Rs of the edge portion of emitter unit 120 formed to be adjacent to a lower portion of the outermost front electrode 141' can be enhanced.

In other words, the sheet resistance of the emitter unit 120 is increased as the thickness of the emitter unit 120 is increased, and is reduced as the thickness of the emitter unit 120 is reduced.

In consideration of this, referring to the change in the sheet resistance value over the distance from the edge to the interior of the substrate 110, when the distance from the edge of the substrate 110 to the portion at which the outermost front electrode 141' is formed is D, the emitter unit 120 has a uniform sheet resistance value (or a substantially uniform sheet resistance value) starting from the second region S2 that is located closer to the interior than when starting from the edge of the substrate 110. Namely, the emitter unit 120 can obtain sufficient average sheet resistance value towards the interior of the substrate 110, starting from the second region S2 of the emitter unit 120 positioned at the edge of the substrate 110.

Accordingly, since a sufficient current can be obtained even by the outermost front electrode 141' positioned at the edge of the substrate 110, the efficiency of the solar cell can be improved.

Figure 5A:
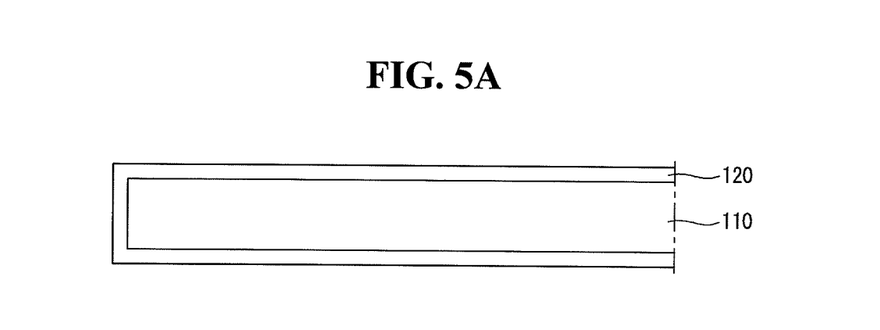
FIGS. 5A to 5F are sequential sectional views showing a process of a method for fabricating a solar cell according to an embodiment of the invention.
Figure 5B:
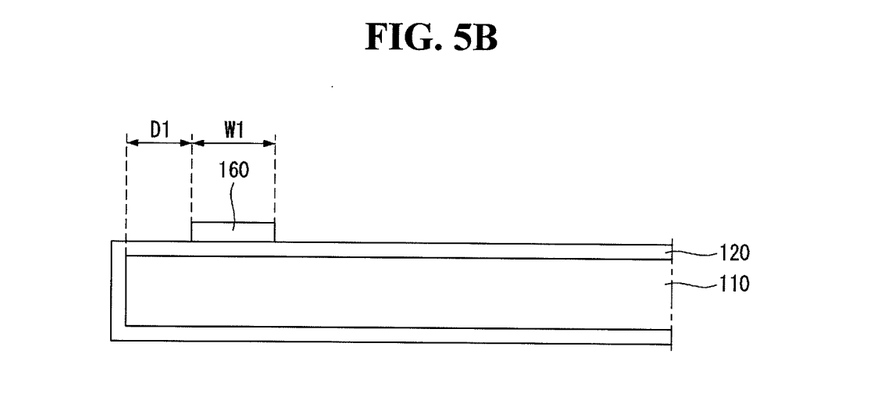
Figure 5C:
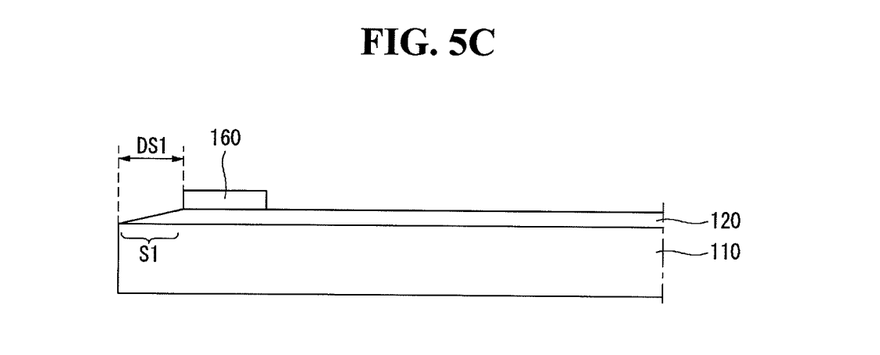
Figure 5D:
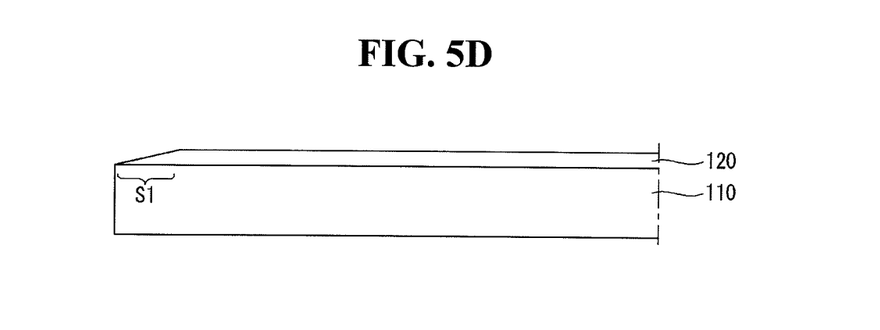
Figure 5E:
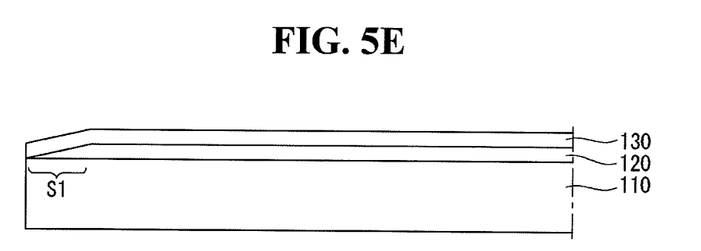
Figure 5F:
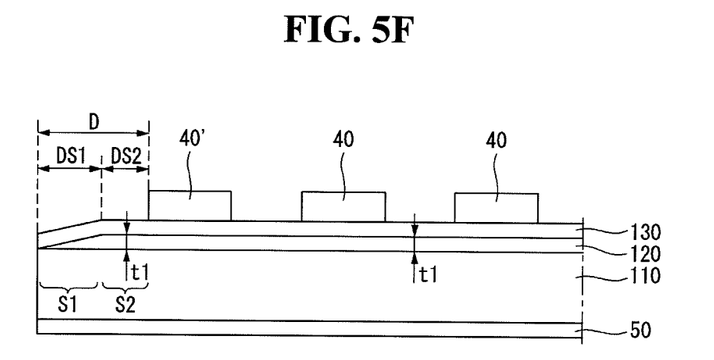

In this instance, the first region S1 of the emitter unit 120 is formed as a portion that is etched to have a varying thickness which increases in going towards the outermost front electrode 141' from the edge of the substrate 110 during the edge isolation process, and although the edge isolation process is performed by using an anti-etching mask 160 as shown in FIG. 5B, the first region S1 of the emitter unit 120 remains, rather than being etched, as shown in FIG. 5F.

In this instance, the edge isolation process according to an embodiment of the invention will be described in detail with reference to FIGS. 5A to 5F.

In this instance, length DS1 of the first region S1 may be 1500 μm or smaller, and length DS2 of the second region S2 may be 1400 μm or smaller.

In this instance, the second region S2 may be a second emitter layer (or a portion) in which second conductivity type impurities are doped with a relatively high concentration. This will be described later with reference to FIGS. 3 and 4.

In this instance, the portion etched through the edge isolation process does not exceed (or extend beyond) the portion in which the front electrode unit 140 is formed, so a shunt is not generated in the electrode unit 140 located close to the edge of the substrate 110, and thus, efficiency of the solar cell 1 can be enhanced.

A solar cell 2 according to another embodiment of the invention will now be described with reference to FIGS. 3 and 4.

Figure 3:
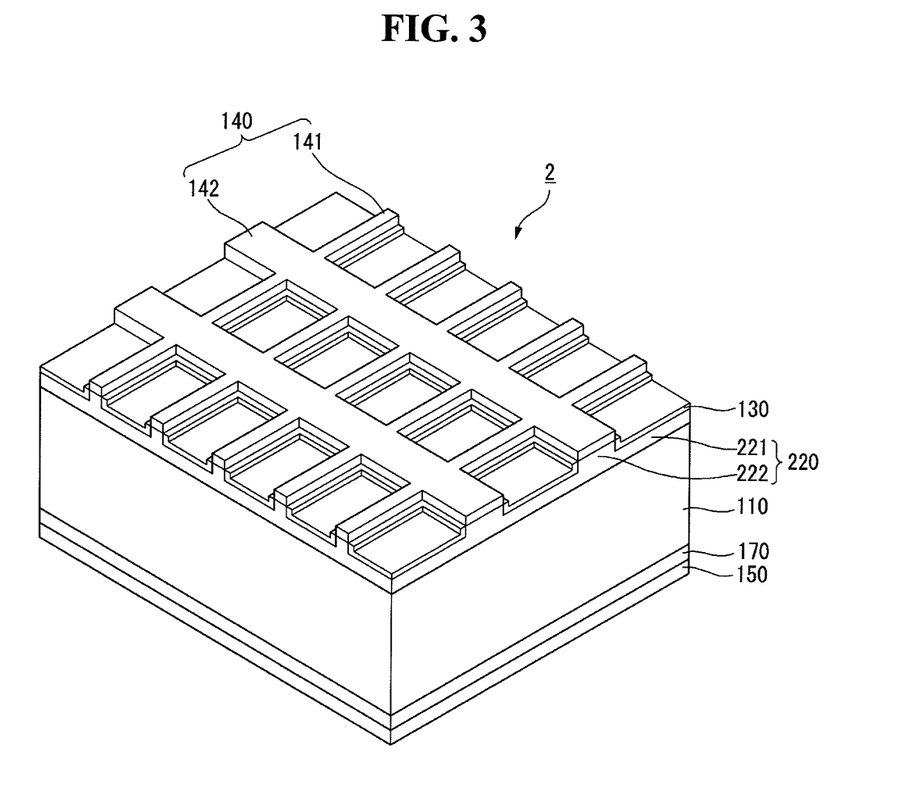
FIG. 3 is a partial perspective view of a solar cell according to another embodiment of the invention.
Figure 4:
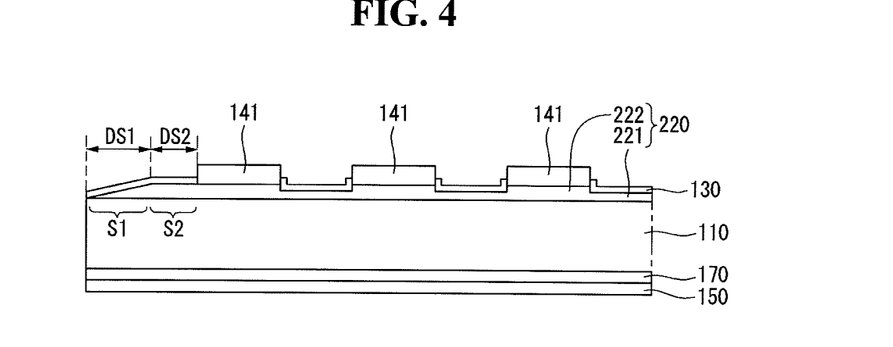
FIG. 4 is a sectional view of the solar cell taken in a direction parallel to a front electrode collection unit and including a portion of the edge of the solar cell according to another embodiment of the invention.

FIG. 3 is a partial perspective view of a solar cell 2 according to another embodiment of the invention, and FIG. 4 is a sectional view of the solar cell taken in a direction parallel to a front electrode collection unit 152 and including a portion of the edge of the solar cell according to another embodiment of the invention. A description of the same element as that of the solar cell 1 illustrated in FIGS. 1 and 2 will be omitted.

With reference to FIG. 3, the solar cell 2 according to another embodiment of the invention includes an emitter unit 220 having a different structure compared with the solar cell 1 according to the embodiment illustrated in FIG. 1.

The emitter unit 220 according to this embodiment includes a first emitter layer 221 positioned on the substrate 110 between mutually adjacent first electrodes 141 and having impurities doped with a low concentration, and a second emitter layer 222 partially positioned under the first electrodes 141 and having impurities doped with a higher concentration than that of the first emitter layer 221. In this embodiment, the front electrodes 141 are formed on the second emitter layer 222.

Like the solar cell 1 as described above with reference to FIGS. 1 and 2, in the solar cell 2 according to this embodiment, the emitter unit 220 positioned at the edge of the substrate 110 may include the first region S1 and the second region S2.

In this instance, the second region S2 of the emitter unit 220 may be formed from the second emitter layer 222.

In order to electrically isolate the front and rear surfaces of the solar cell 2 according to this embodiment, an edge isolation process is required, and likewise, as in the embodiment illustrated in FIG. 1, after an anti-etching mask is formed on the emitter unit 220, the edge isolation process is performed through wet etching, to thus improve sheet resistance Rs characteristics of the solar cell 2.

In other words, the sheet resistance value over the distance from the edge of the substrate 110 reaches an average sheet resistance value starting from the second region S2 between the substrate 110 and the front electrode unit 140 closest to the substrate 110.

In this instance, since the portion etched through the edge isolation process does not exceed (or extend beyond) the portion of the emitter layer on which the front electrode is formed, a shunt is not generated in the front electrode closest to the edge of the substrate 110. Also, since the impurity concentration of the first emitter layer 221 is low, efficiency of collecting carriers generated by short wavelength light is increased, thereby increasing a short circuit current density Jsc and an open voltage Voc, and since the impurity concentration of the second emitter layer 222 is high, contact resistance with the front electrode is reduced, thereby improving the efficiency of the solar cell 2.

The solar cells 1 and 2 having the foregoing structure operate as follows.

When light is irradiated to the solar cells 1 and 2 and made incident to the semiconductor substrate 110 through the anti-reflective film 130 and the emitter units 120 and 220, respectively, electron-hole pairs are generated in the semiconductor substrate 110 by light energy. At this time, a reflection loss of light that is made incident to the substrate 110 is reduced by virtue of the anti-reflective film 130, thereby increasing the quantity of light incident to the substrate 110.

The electrons and holes are separated by the p-n junction of the substrate 110, and the emitter units 120 or 220, and the electrons and the holes move toward, for example, the emitter units 120 or 220 having n conductivity type and the substrate 110 having a p conductivity type, respectively. The electrons which have moved toward the emitter units 120 or 220 are collected by the front electrodes 141 so as to be transmitted to, and collected by, the front electrode current collection units 142, and the holes which have moved toward the substrate 110 are transferred to the adjacent rear electrode 150 and then collected by the rear electrode current collection unit. When the front electrode current collection units 142 and the rear electrode current collection unit are connected by a wire, current flows and this is used as power.

An example of a method for fabricating the solar cell 1 according to an embodiment of the invention will be described with reference to FIGS. 5A to 5F and 6.

Figure 6:
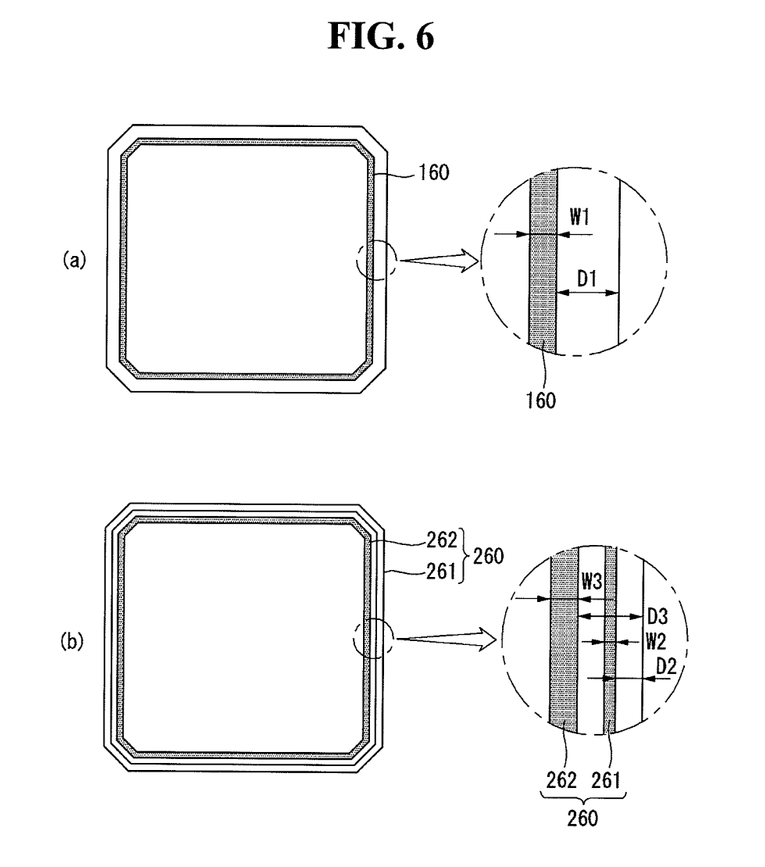
FIG. 6 show plan views of an anti-etching mask used for wet edge isolation using an etching solution according to various embodiments of the invention.

FIGS. 5A to 5F are sequential sectional views showing a process of a method for fabricating a solar cell according to an embodiment of the invention. FIG. 6 show plan views of an anti-etching mask formed according to various embodiments of the invention.

First, as shown in FIG. 5A, impurities of a pentavalent element are diffused on the substrate 110 made of a p type single crystal or polycrystalline silicon to form the emitter unit 120 on the entire surface of the substrate 110. The emitter unit 120 is obtained by thermally treating a material, such as $PoCl_3$, $H_3PO_4$, or the like, that includes impurities of a pentavalent element such as phosphorus (P), arsenic (As), antimony (Sb), or the like, onto the substrate 110.

Unlike this embodiment, when the conductivity type of the substrate 110 is n type, a p type emitter unit may be formed on the entire surface of the substrate 110 by thermally treating or stacking thereon a material, e.g., $B_2H_6$, that includes impurities of a trivalent element.

FIGS. 5B to 5D show an edge isolation method of isolating the emitter units formed on the front and rear surfaces of the substrate 110 by using wet etching after forming the anti-etching mask 160 on the front surface of the substrate 110.

In the process of forming the emitter unit 120, impurities are also doped even on the edge portion (or the side portion) of the substrate 110, so the front and rear surfaces of the solar cell 1 are electrically connected so as to reduce the efficiency of the solar cell 1. Thus, a side isolating process of electrically isolating the front and rear surfaces of the solar cell 1 by eliminating the portion doped on the edges of the substrate 110 is required.

For the side isolation of the solar cell 1, edge isolation using wet etching, edge isolation using a laser, and edge isolation using plasma, and the like, may be used.

The plasma side isolation method in which substrates are piled to have a stacked structure, like coins being piled up, and a plasma process being performed thereon has a problem in which plasma soaks in between the substrates 110 to damage the emitter unit 120 formed on the front surface of the substrate 110, and a high polymer is generated by gas in use and deposited on the etched surface, reducing the efficiency of the solar cell 1.

Also, when the edge isolation process using a laser is performed, a processing time is lengthened and the surface of the substrate 110 is damaged by a high temperature laser, reducing the efficiency of the solar cell 1. Also, when a laser beam is irradiated to the front surface of the substrate 110, a light receiving area is much reduced, thereby reducing a short circuit current Jsc, which results in a reduction in the efficiency of the solar cell 1.

In the instance of an edge isolation process of isolating the emitter unit formed on the rear surface and the side surface of the substrate 110 by using an etching solution, the etching solution invades a portion close to the edge of the emitter unit 120 formed on the front surface of the substrate 110 during the process due to hydrophilicity of an oxide (phosphorous silicate glass, PSG) layer including phosphorous generated as the impurities spread into the interior of the substrate 110, which potentially damage the emitter unit 120, and thereafter, there is high possibility of generating a shunt in forming the front electrodes 141. Thus, the efficiency of the solar cell 1 is lowered.

In order to address or solve these problems, in an embodiment of the invention, as one of the edge isolation methods, the anti-etching mask 160 is formed, and then, the emitter unit 120 formed on the side surface of the substrate 110 and the rear surface of the substrate 110 is removed by using wet etching.

As shown in FIG. 5B, before removing the emitter unit 120 formed on the side surface and the rear surface of the substrate 110 by using wet etching, the anti-etching mask 160 is formed. In this embodiment, a hydrophobic material is applied by using screen printing method and is then dried at 100° C. to 150° C. to thereby form the anti-etching mask 160, but the invention is not limited thereto.

The anti-etching mask 160 serves to prevent the emitter unit 120 formed on the front surface of the substrate, excluding a portion of the edge of the front surface of the substrate 110, from being etched.

In this instance, as shown in (a) of FIG. 6, the anti-etching mask 160 is formed with a certain interval D1 from the edge of the substrate 110. In this embodiment, the interval D1 between the edge of the substrate 110 and the anti-etching mask 160 is 1.5 mm or smaller. In another instance, the anti-etching mask 160 may be formed right up to the edge of the substrate 110 so as to be without the interval from the edge of the substrate 110.

Alternatively, an anti-etching mask with a plurality of lines may be formed. For example, as shown in (b) of FIG. 6, an anti-etching mask 260 including a first mask line 261 spaced apart by a first interval D2 from the edge of the substrate 110 and a second mask line 262 spaced apart by a second interval D3 from the edge of the substrate 110 may be formed. In FIG. 6, an outline of the anti-etching mask corresponds to a shape of the substrate 110.

In this instance, the second interval D3 between the edge of the substrate 110 and the second mask line 262 may be 1.5 mm or smaller.

When the anti-etching mask 260 is formed by double lines according to this embodiment, the front and back sides of the substrate 110 can be reliably isolated by using an etching solution in a follow-up process while reducing a loss of a section of the emitter unit 110 or 220.

And then, as shown in FIG. 5C, the emitter unit 120 formed on the rear surface of the substrate 110 is immersed (or dipped) in an etching solution to remove the emitter unit 120 formed on the side surface and the rear surface of the substrate 110. In this instance, since the anti-etching mask 160 is formed to enclose an interior area of the entire front surface of the substrate, the etching solution cannot invade into the emitter unit 120 formed at an inner side of the anti-etching mask 160, thus reducing damage to the emitter unit 120 formed on the front surface of the substrate 110.

In this instance, due to the hydrophilicity of the emitter unit 120, the etching solution invades the portion of the emitter unit 120 positioned at the edge of the front surface of the substrate 110, partially etching the portion of the emitter unit 120 positioned at the edge of the front surface of the substrate 110.

Accordingly, in the first region S1 of the emitter unit 120, the thickness gradually increases from the edge of the front surface of the substrate 110 to the interior of the substrate 110 where the outermost front electrode 141' of the substrate 110 is formed. The first region S1 has the length DS1.

After the edge isolation process is performed, the anti-etching mask 160 is removed by using a potassium hydroxide (KOH) solution, or the like, as shown in FIG. 5D.

And then, as shown in FIG. 5E, the anti-reflective film 130 is formed on the front surface of the substrate 110 by using chemical vapor deposition (CVD) such as plasma enhanced chemical vapor deposition (PECVD).

Thereafter, as shown in FIG. 5F, a front electrode paste is printed on portions of the anti-reflective film 130 by using a screen printing method and is then dried to form a front electrode pattern 40 for forming the front electrodes 141. In this instance, in this embodiment, a pattern for forming the plurality of front electrode current collection units 142 may be additionally formed, and in this instance, the front electrode current collection units 142 may be formed together as well as the front electrodes 141 by using the front electrode pattern 40.

In this instance, the pattern 40' for forming the outermost front electrode among the front electrode pattern 40 may be formed to be spaced apart by the length DS2 of the second region S2 from the first region S1 of the emitter unit 120.

Then, a rear electrode paste is printed (or applied) through the screen printing method and is then dried to form a rear electrode pattern 50 on the emitter unit 120 formed on the rear surface of the substrate 110. In this instance, the rear electrode paste may include at least one selected from the group consisting of nickel (Ni), copper (Cu), silver (Ag), aluminum (Al), tin (Sn), zinc (Zn), indium (In), titanium (Ti), gold (Au), and any combination thereof. Other metal materials may also be used.

In this instance, the temperature for drying the patterns 40 and 50 may range from 120° C. to 200° C., and the order of forming the patterns 40 and 50 may be changed.

The substrate 110 with the front electrode pattern 40 and the rear electrode pattern 50 formed thereon is thermally treated at a temperature ranging from 750° C. to 800° C., to form the front electrode units 140 including the plurality of front electrodes 141 in contact with portions of the emitter unit 120 and the plurality of front electrode current collection units 142, the rear electrode 150 electrically connected with the substrate 110, and the rear field unit 170 between the rear electrode 150 and the substrate 110, thus completing the solar cell 1 (FIGS. 1 and 2).

In this instance, when the thermal treatment is performed, the plurality of front electrodes 141 and the front electrode current collection units 142 in contact with the emitter unit 120 are formed by penetrating the anti-reflective film 130 at the contact portions by lead (Pb), or the like, contained in the front electrode pattern 40, and the rear electrode 150 is formed form the rear electrode pattern 50. Also, contact resistance is reduced through chemical bonding between the layers of the emitter unit 120 and the substrate 110 in contact with the metal components contained in the respective patterns 40 and 50, improving current flow.

As described above, after the anti-etching masks 160 or 260 are formed, when edge isolation is performed through wet etching, sheet resistance characteristics thereof can be improved in comparison to the instance in which edge isolation is performed through wet etching without using a mask or the instance in which edge isolation is performed by using plasma or a laser, and since damage to the light receiving surface is reduced, the solar cell 1 having high efficiency can be fabricated.

Figure 9:
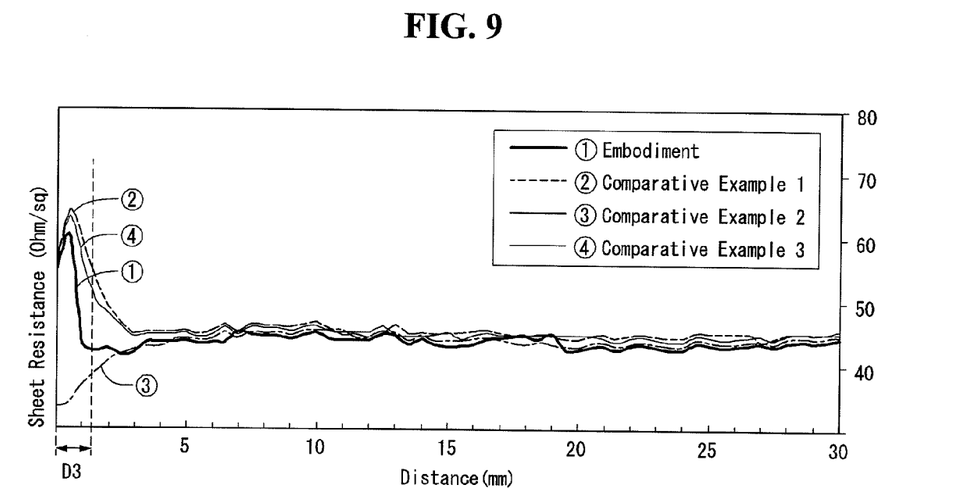
FIG. 9 is a graph of sheet resistance (or surface resistivity) according to methods for fabricating a solar cell according to an embodiment of the invention and Comparative Examples.
Figure 10:
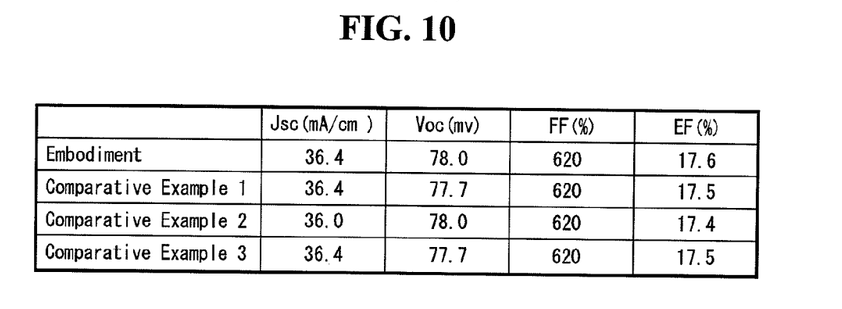
FIG. 10 is a table comparatively showing conversion efficiency according to methods for fabricating a solar cell according to an embodiment of the invention and Comparative Examples.

FIG. 9 is a graph of sheet resistance (or surface resistivity) according to methods for fabricating a solar cell according to an embodiment of the invention and Comparative Examples. FIG. 10 is a table comparatively showing conversion efficiency according to the methods for fabricating a solar cell according to an embodiment of the invention and Comparative Examples.

In FIG. 9, ① denotes a change in a sheet resistance value over the distance from the edge of the substrate 110 when the side is isolated through wet etching after the anti-etching mask 160 is formed according to an embodiment of the invention, ② denotes a change in a sheet resistance value over the distance from the edge of the substrate when the side is isolated by using plasma (Comparative Example 1), ③ denotes a change in a sheet resistance value over the distance from the edge of the substrate when the side is isolated by using a laser (Comparative Example 2), and ④ denotes a change in a sheet resistance value over the distance from the edge of the substrate when the side is isolated by using only a wet solution without forming a mask (Comparative Example 3).

In FIG. 9, D3 denotes the distance from the edge of the substrate 110 to a portion where the closest front electrode relative to the edge is to be formed. As shown in FIG. 9, in the instance of Comparative Example 1 to Comparative Example 3, the sheet resistance values are high even in the portions of the emitter unit 120 that are beyond where the front electrode is to be formed, and fails to reach an average sheet resistance value. In this instance, as described above, when the front electrode is formed afterward, shunt is highly likely to be generated at the electrode near the edge of the substrate 110, degrading the efficiency of the solar cell. In comparison, in the instance in which a mask is formed and the side isolating is performed by using wet etching as in the embodiment of the invention, the sheet resistance value is essentially uniform from the portion where the front electrode is to be formed, unlike Comparative Example 1 to Comparative Example 3. Namely, it is noted that the etched portion does not extend beyond the portion where the front electrode is to be formed, and thus, a shunt is not generated at the electrode near the edge of the substrate 110, improving the efficiency of the solar cell.

In Table of FIG. 10, an embodiment of the invention and Comparative Example 1 to Comparative Example 3 are the same as those of FIG. 9, Jsc indicates a short circuit current of the solar cells, Voc denotes an open current of the solar cells, and FF denotes a fill factor, and EF denotes conversion efficiency. It is noted that the conversion efficiency of the solar cell 1 according to Embodiment of the invention in which the mask is formed and the side isolating is performed through wet etching is greater than that of Comparative Example 1 to Comparative Example 3.

Namely, when the anti-etching mask 160 is formed along the edges of the substrate 110 and wet etching is performed as in the embodiment of the invention, since the etched portion does not extend beyond the portion where the mask 160 is formed, the emitter unit 120 formed on the front surface of the substrate 110 is not damaged, to thereby fabricating the solar cell 1 having high conversion efficiency.

An example of the method for fabricating the solar cell 1 according to another embodiment of the invention will be described with reference to FIGS. 7A, 7B, and 8.

Figure 7A:
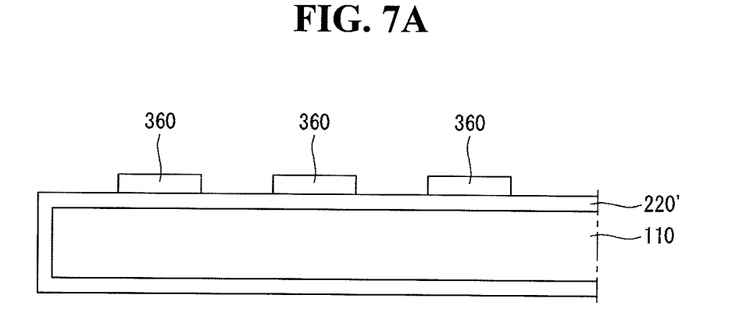
FIGS. 7A and 7B are sequential sectional views showing a process of a method for fabricating a solar cell according to another embodiment of the invention.
Figure 7B:
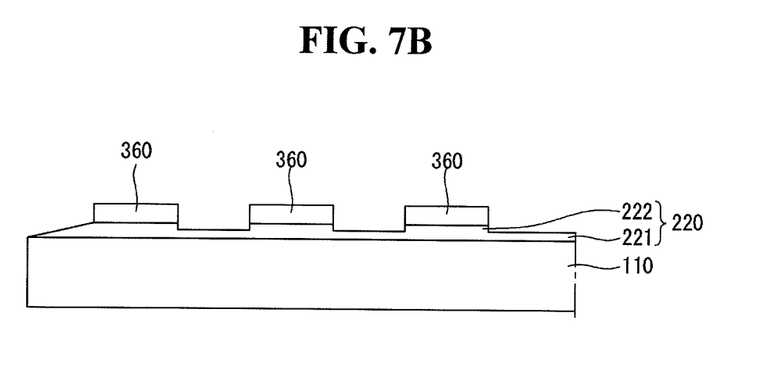
Figure 8:
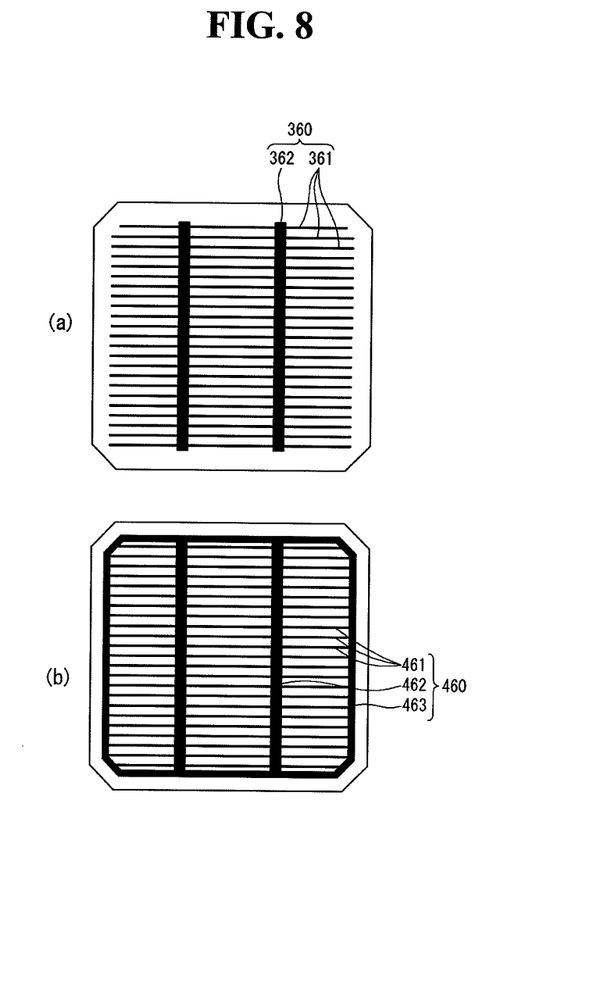
FIG. 8 show plan views of an anti-etching mask used for wet edge isolation using an etching solution according to various embodiments of the invention.

FIGS. 7A and 7B are view sequentially showing an example of a method for fabricating a solar cell according to another embodiment of the invention, and FIG. 8 is a plan view of anti-etching masks formed according to various embodiments of the invention. A description of the same content as that of FIGS. 5A to 5F will be omitted.

First, as shown in FIG. 7A, the n type impurities are spread or diffused on the substrate 110 made of the p type single crystal or polycrystalline silicon to form the emitter unit 220' on the entire surface of the substrate 110. In this instance, the concentration of the n type impurities is the highest on the surface of the emitter unit 220' and is gradually reduced toward the inner side of the emitter unit 220' according to Gaussian distribution or an error function.

Next, as shown in FIG. 7A, an anti-etching mask 360 is formed on a portion where the front electrode is to be formed, such that it has the same pattern as that of the front electrode pattern 40. In this instance, as shown in (a) of FIG. 8, a first portion 361 of the anti-etching mask 360 may be formed at portions where a plurality of front electrodes are to be formed, and a second portion 362 of the anti-etching mask 360 may be formed at portions where a plurality of front electrode current collection units are to be formed. The width of the first portion 361 and that of the second portion 362 of the anti-etching mask 360 may be equal to or greater than the width of the front electrodes and that of the front electrode current collection units, respectively.

Alternatively, as shown in (b) of FIG. 8, a first portion 461 of the anti-etching mask 460 may be formed at portions where the plurality of front electrodes are to be formed, a second portion 462 of the anti-etching mask 460 may be formed at portions where the plurality of front electrode current collection units are to be formed, and a third portion 463 of the anti-etching mask 460 may be formed along the edges of the substrate 110. In this instance, the third portion 463 may be formed to have a plurality of lines. The shape of the anti-etching mask 460 is not limited to the embodiment illustrated in FIG. 8.

Then, as shown in FIG. 7B, the emitter unit 220' is etched back to form the selective emitter unit 220 such that the selective emitter 220 unit includes the first emitter layer 221 positioned on the substrate 110 and having impurities doped with low concentration therein and the second emitter layer 222 positioned on portions of the first emitter layer 221 and having impurities doped with high concentration Thereafter, the substrate 110 is immersed (or dipped) in an etching solution such that the emitter unit 220' formed on the side surface and the rear surface of the substrate 110 is removed, thus performing edge isolation. The formation process of the selective emitter unit 220 and the edge isolation process may be simultaneously performed.

Thereafter, the anti-etching mask 460 is removed, the anti-reflective film 130 is formed, and then, the front electrode 140, the rear electrode 150, and the rear field unit 170 are formed to complete the solar cell 2 (FIGS. 3 and 4).

In this manner, when the mask for forming the selective emitter unit 220 and the mask for the edge isolation process are simultaneously formed, damage to the emitter unit 120 which may be generated during the edge isolation process can be reduced or prevented and there is no need to additionally form the mask for forming the selective emitter unit 220, simplifying the fabrication process, shortening the fabrication time, and reducing the fabrication costs.

In addition, since the selective emitter unit 220 formation process and the edge isolation process are simultaneously performed through wet etching, the fabrication process can be further simplified and the solar cell 2 having high efficiency can be fabricated.

While the invention has been shown and described in connection with the embodiments, it will be apparent to those skilled in the art that modifications and variations can be made without departing from the spirit and scope of the invention as defined by the appended claims.

What is claimed is:

1. A solar cell comprising:
   a first conductivity type substrate;
   an emitter unit having a second conductivity type opposite to the first conductivity type, and forming a p-n junction with the substrate;
   an anti-reflective film positioned on the emitter unit;
   a plurality of first electrodes positioned on the anti-reflective film and connected with the emitter unit; and
   a second electrode connected with the substrate,
   wherein the emitter unit includes a first region and a second region that are positioned between an outermost first electrode among the plurality of first electrodes and the edge of the substrate,
   wherein a thickness of the first region gradually increases in going from the edge of the substrate to the outermost first electrode, and a thickness of the second region is uniform,
   wherein the first region of the emitter unit has an inclined surface from the edge of the substrate to the second region by the gradual thickness increase of the first region, and
   wherein the anti-reflective film has an inclined surface from top part of the edge of the substrate to top part of the second region.

2. The solar cell of claim 1, wherein the second region is located between the first region and the outermost first electrode.

3. The solar cell of claim 1, wherein the thickness of the second region is equal to a thickness of the emitter unit positioned between mutually adjacent first electrodes.

4. The solar cell of claim 2, wherein a length of the second region is 1400 μm or smaller.

5. The solar cell of claim 1, wherein the emitter unit further includes a first emitter layer and a second emitter layer, the first emitter layer having impurities of the second conductivity type doped therein and being positioned between mutually adjacent first electrodes, and the second emitter layer having the impurities of the second conductivity type doped with a higher concentration than that of the first emitter layer and being positioned under the plurality of first electrodes.

6. The solar cell of claim 5, wherein the second emitter layer includes the second region.

7. The solar cell of claim 5, wherein a thickness of the first emitter layer is uniform between mutually adjacent first electrodes and a thickness of the second emitter layer is uniform under the plurality of first electrodes, and the thickness of the first emitter layer is less than the thickness of the second emitter layer.

8. The solar cell of claim 1, wherein a length of the first region is 1500 μm or smaller.

9. The solar cell of claim 1, further comprising:
   a rear field unit connected to the second electrode.

* * * * *